(12) United States Patent
Vissiere et al.

(10) Patent No.: US 11,592,512 B2
(45) Date of Patent: Feb. 28, 2023

(54) METHOD FOR CALIBRATING A MAGNETOMETER

(71) Applicant: SYSNAV, Vernon (FR)

(72) Inventors: David Vissiere, Paris (FR); Charles-Ivan Chesneau, Paris (FR); Mathieu Hillion, Vernon (FR); Hendrik Meier, Vernon (FR); David Caruso, Paris (FR)

(73) Assignee: SYSNAV, Vernon (FR)

( * ) Notice: Subject to any disclaimer, the term of this patent is extended or adjusted under 35 U.S.C. 154(b) by 159 days.

(21) Appl. No.: 16/634,045

(22) PCT Filed: Jul. 26, 2018

(86) PCT No.: PCT/FR2018/051914
§ 371 (c)(1),
(2) Date: Jan. 24, 2020

(87) PCT Pub. No.: WO2019/020945
PCT Pub. Date: Jan. 31, 2019

(65) Prior Publication Data
US 2020/0233053 A1    Jul. 23, 2020

(30) Foreign Application Priority Data

Jul. 26, 2017   (FR) ...................... 1757082

(51) Int. Cl.
*G01R 35/00*   (2006.01)
*G01C 17/38*   (2006.01)
(Continued)

(52) U.S. Cl.
CPC .......... *G01R 35/005* (2013.01); *G01C 17/38* (2013.01); *G01C 25/00* (2013.01); *G01R 33/02* (2013.01)

(58) Field of Classification Search
None
See application file for complete search history.

(56) References Cited

U.S. PATENT DOCUMENTS

| 5,134,369 A | 7/1992 | Lo et al. |
| 7,932,718 B1 * | 4/2011 | Wiegert ............... G01R 33/022 324/247 |

(Continued)

FOREIGN PATENT DOCUMENTS

| EP | 2541199 A1 | 1/2013 |
| FR | 2914739 A1 | 10/2008 |
| FR | 3069053 A1 | 1/2019 |

OTHER PUBLICATIONS

International Preliminary Report on Patentability received for PCT Patent Application No. PCT/FR2018/051914, dated Feb. 6, 2020, 35 pages (20 pages of English Translation and 15 pages of Original Document).

(Continued)

*Primary Examiner* — Nasima Monsur
(74) *Attorney, Agent, or Firm* — Womble Bond Dickinson (US) LLP

(57) ABSTRACT

A method for calibrating a magnetometer. The magnetometer travels through (Si) a set of path positions, and acquires (S2) a plurality of measurements of the magnetic field. Trajectory information (S3) is provided representative of the location and the orientation of a point integral with the magnetometer. The measurements of the magnetic field are matched up (S4) with the trajectory information. A determination (S5) is made of calibration parameters of the magnetometer by the minimisation of a cost function involving, for a plurality of determination times, at least the calibration parameters, a measurement of the magnetic field, and a relationship linking the change in a magnetic field with (Continued)

the change in the location and in the orientation of the magnetometer derived from the trajectory information.

17 Claims, 2 Drawing Sheets

(51) Int. Cl.
    *G01C 25/00*     (2006.01)
    *G01R 33/02*     (2006.01)

(56) References Cited

U.S. PATENT DOCUMENTS

| | | |
|---|---|---|
| 2011/0077889 A1 | 3/2011 | Vogt |
| 2014/0222409 A1* | 8/2014 | Efrat .................. G01R 33/10 |
| | | 703/13 |
| 2014/0278191 A1* | 9/2014 | Anderson ............ G01P 21/00 |
| | | 702/104 |

OTHER PUBLICATIONS

International Search Report and Written Opinion received for PCT Patent Application No. PCT/FR2018/051914, dated Oct. 8, 2018, 39 pages (21 pages of English Translation and 18 pages of Original Document).

Preliminary Research Report received for French Application No. 1757082, dated Jun. 14, 2018, 5 pages (1 page of French Translation Cover Sheet and 4 pages of original document).

Zhang, Zhi-Qiang, "Two-Step Calibration Methods for Miniature Inertial and Magnetic Sensor Units", IEEE Transactions on Industrial Electronics, vol. 62, No. 6, Jun. 2015, pp. 3714-3723.

\* cited by examiner

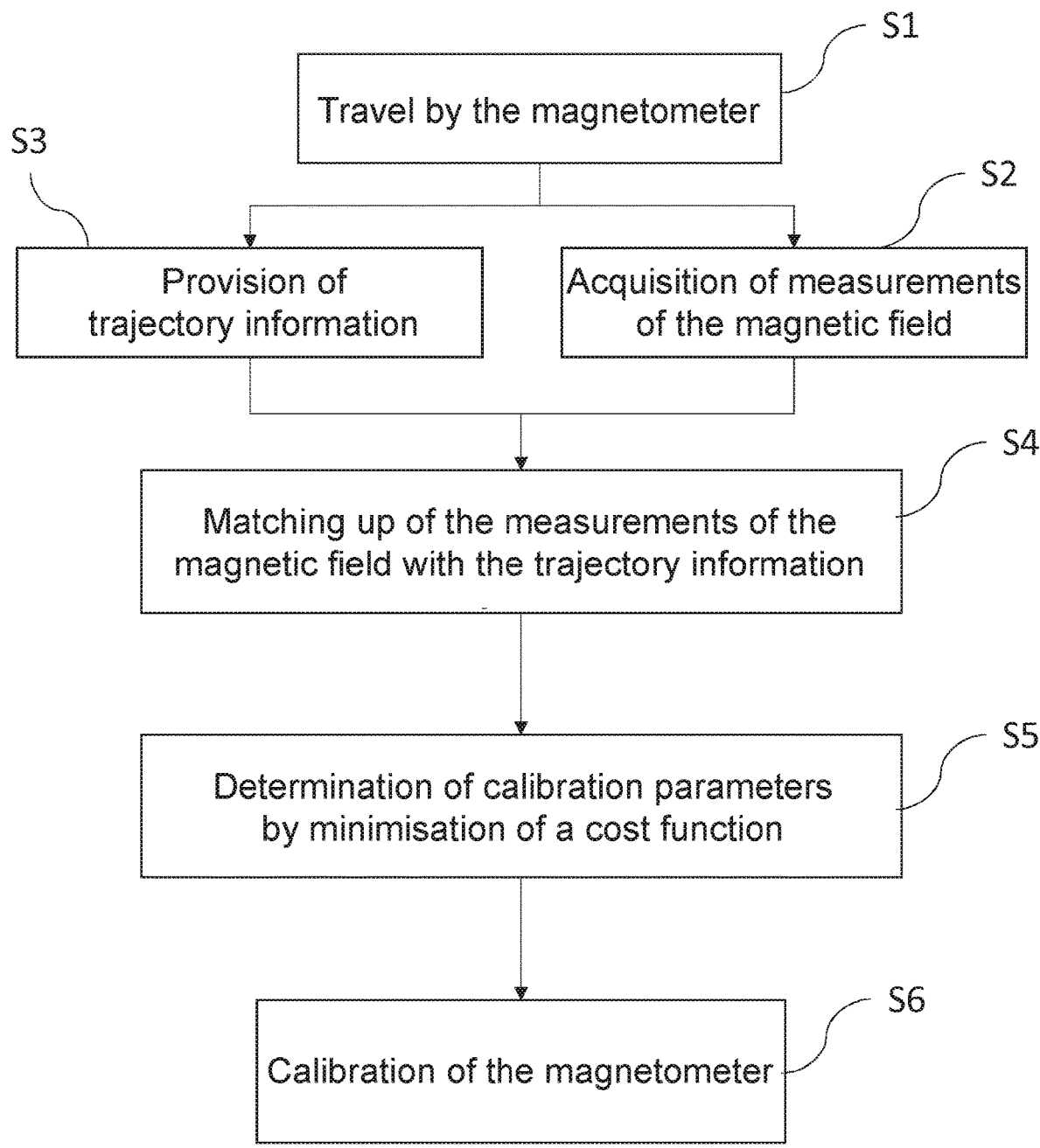

METHOD FOR CALIBRATING A MAGNETOMETER

GENERAL TECHNICAL FIELD

The present invention relates to the field of magnetometers. More precisely, it relates to a method for calibrating at least one magnetometer.

CONTEXT AND TECHNOLOGICAL BACKGROUND

The magnetic field is a vector field in three-dimensional space, that is to say associating a magnetic field vector noted B of three dimensions with each location in space. The magnetic field at a point is characterised by its norm and its direction.

A magnetometer makes it possible to measure the magnetic field at a point. A magnetometer may be a monoaxial magnetometer, capable of measuring a component of the magnetic field in a position, i.e. the projection of the magnetic field vector $\vec{B}$ at the level of said magnetometer along its axis. A magnetometer may also be a triaxial magnetometer, capable of measuring the magnetic field along its three axes, which may be constituted of three monoaxial magnetometers rigidly connected together and oriented along different axes, generally substantially orthogonal.

However, the measurement of the magnetic field by a magnetometer is not perfect, such that the measurement of the magnetic field deviates from the real magnetic field. For example, hard iron effects may be created by remanence of certain components at strong magnetic fields and lead to measurement biases. Scale factors can also distort the measurement. Furthermore, effects due to the physical configuration of the magnetometer and to the mounting of the magnetometer can also affect the measurement.

It is thus possible for example to express the measurement of a triaxial magnetometer in the following linear form:

$$\vec{B}_m = D\vec{B} + \vec{b}$$

where $\vec{B}_m$ is the measurement of the magnetic field by the magnetometer, $\vec{B}$ is the real magnetic field, D is a matrix called scale factor, and $\vec{b}$ is a measurement bias. The scale factor and measurement bias are thus measurement parameters that pollute the measurement of the magnetic field with respect to the real magnetic field. It is advisable to estimate these parameters in order to be able to correct the measurement of the magnetic field before using it elsewhere. The calibration of a magnetometer comes down to determining these parameters and deducing therefrom corrections (by inversion of the form of the measurement model for example) to make to the magnetometer outputs in order that the corrected measurement reflects most faithfully the real magnetic field.

A precise calibration of the magnetometer is notably required for applications which require great precision. In particular, a magneto-inertial unit may include, apart from accelerometers, a network of several magnetometers arranged at different locations which enable the simultaneous estimation of the field and the magnetic gradient, in order to make it possible to determine notably an estimation of the velocity vector and the position vector during a navigation. The documents FR2914739B1 and EP2541199 thus disclose so-called magneto-inertial navigation approaches. The precision of these measurements is essential to the good performance of reconstruction of the movement of the magneto-inertial unit.

Furthermore, the respective position and orientation of each of the magnetometers of such a magneto-inertial unit may also constitute parameters influencing the measurement. The calibration may also include the determination of these parameters.

Several methods for calibrating a magnetometer have been proposed. One of these methods consists in making the magnetometer pivot in a space in which the magnetic field is constant and non-disturbed, for example the Earth's magnetic field in a place exempt of disturbances, such as an agricultural field. A triaxial magnetometer with affine response placed in the constant magnetic field according to an arbitrary orientation sees the space of its raw measurements identifiable with an ellipse. A reciprocal transformation makes it possible to send this raw measurement space to a spherical calibrated measurement space by identifying the parameters of the ellipse which give in a virtually direct manner the calibration parameters.

The article of Zhi-Quiang Zhang "Two step calibration methods for miniature inertial and magnetic sensor units", IEEE Transactions on Industrial Electronics, vol. 62, no. 6, 1 Jun. 2015, pages 3714-3723, thereby describes a method for calibrating a magnetometer which exploits the Earth's magnetic field M assumed constant and non-disturbed.

This method is however complicated since it requires having available a place with a homogeneous field and constant over time (constant norm). It is also necessary to transport the magnetometers to calibrate outside, and to individually handle them. In addition, this method, if it effectively makes it possible to identify the intrinsic parameters of a magnetic sensor (bias, scale factor), does not make it possible to identify the geometric calibration parameters (relative position of the magnetometers) of a network of magnetometers.

Another method consists in arranging the magnetometers to calibrate in an imposed magnetic field, for example generated by means of current controlled Helmholtz coils such that the magnetic field generated is homogeneous and of constant norm. Since the magnetic field is known, in amplitude and in orientation, it then suffices to parameterise an error model of the magnetometers by comparing the magnetometer outputs with the imposed magnetic field. However, this method requires, to be able to have available a non-disturbed imposed magnetic field, the putting in place of a complex infrastructure which may be costly, heavy and bulky. In addition, the question is also posed of the precision of the knowledge of the generated magnetic field, also necessitating calibration thereof.

The patent application US 2014/222409 A1 thereby discloses a method for calibrating a magnetometer within the scope of a magnetic field mapping, involving a model linking the value of a magnetic field with the location and the orientation of the magnetometer, for a plurality of different locations and orientations in a volume of interest to the magnetic field imposed by a magnetic field generator.

DESCRIPTION OF THE INVENTION

The aim of the invention is to overcome at least in part these drawbacks and preferentially aims notably to propose a method for calibrating a magnetometer or a network of magnetometers that is simple to implement and precise. This method is made possible by the exploitation of a relationship linking the change in magnetic field and the movement of the magnetometer.

To this end, a method for calibrating a magnetometer is proposed including the following steps:
the magnetometer travels through a set of path positions, said positions being distinguished from each other by a location of the magnetometer and/or by an orientation of the magnetometer;
acquisition by the magnetometer at acquisition times of a plurality of measurements of the magnetic field when the magnetometer travels through said set of path positions;
provision of trajectory information representative of the location and the orientation of a point integral with the magnetometer while travelling through the set of path positions at travel times,
for each of a plurality of determination times determined from the acquisition times and the travel times, matching up of the measurements of the magnetic field with the trajectory information,
determination of calibration parameters of the magnetometer by minimisation of a cost function involving, for a plurality of determination times, at least said calibration parameters, a measurement of the magnetic field, and a relationship linking the change in a magnetic field with the change in the location and in the orientation of the magnetometer derived from the trajectory information, the relationship linking the change in a magnetic field with the change in the location and in the orientation of the magnetometer locally translating an equation of the particular derivative of the magnetic field:

$$\dot{\vec{B}} = \nabla \vec{B} \cdot \vec{v} + \Omega \times \vec{B}$$

with $\vec{B}$ a magnetic field vector, $\nabla \vec{B}$ a magnetic field gradient vector, $\dot{\vec{B}}$ a vector of the time derivative of the magnetic field, $\vec{v}$ a velocity vector representative of the modification of the location and $\Omega$ a rotation matrix representative of the modification of the orientation.

The method thus proposes, from information on the movement of the magnetometer, deducing the calibration parameters of the magnetometer which next make it possible to measure precisely the magnetic field, and potentially the magnetic field gradient.

The method is advantageously completed by the following characteristics, taken alone or in any technically possible combination thereof:
the cost function involves error terms concerning the change in the location and in the orientation of the magnetometer derived from the trajectory information;
the cost function involves error terms concerning sensor measurements, said sensor measurements taken alone making it possible to obtain the trajectory information, the trajectory information then being determined at the same time as the calibration parameters;
the minimisation of the cost function is carried out with a state observer;
the cost function is based on comparisons between a theoretical estimation of the measurement of the magnetic field at a determination time and a measurement of the magnetic field at said determination time, the theoretical estimation of the magnetic field taking into account the calibration parameters;
the theoretical estimation of the measurement of the magnetic field is determined from the relationship linking the change in a magnetic field with the change in the location and in the orientation of the magnetometer derived from the trajectory information;
the theoretical estimation of the measurement of the magnetic field is determined at least from:
a measurement of the magnetic field at a preceding determination time,
the change in the location and in the orientation of a point integral with the magnetometer between the determination time and the preceding determination time, determined from the trajectory information,
calibration parameters;
the method also includes an acquisition at acquisition times of a plurality of measurements of a magnetic field gradient when the magnetometer travels through said set of path positions, and the theoretical estimation of the magnetic field is also determined from a measurement of the magnetic field gradient at the preceding determination time;
the theoretical estimation of the measurement of the magnetic field at a determination time is determined from:
a strength of the magnetic field at a reference point,
a magnetic field gradient at said reference point, and
the difference between the location of the point integral with the magnetometer and a location of the reference point,
the rotation between the orientation of the point integral with the magnetometer and an orientation at the reference point,
the strength of the magnetic field at a reference point and the magnetic field gradient at said reference point being determined by minimisation of the cost function;
the calibration parameters include:
a first magnetometric bias affecting the measurement of the magnetic field, and/or
a second magnetometric bias affecting a measurement of a magnetic field gradient, and/or
a scale parameter affecting an amplitude of the measurement of the magnetic field and/or
spatial configuration parameters of the magnetometer;
the matching up consists in interpolating at least one set among:
a set of measurements of the magnetic field and the magnetic field gradient,
a set of trajectory information,
such that each determination time corresponds to at least one measurement of the magnetic field and the trajectory information;
the trajectory information is provided by the use of an imager pinpointing the location and the orientation of the magnetometer at each travel time when the magnetometer travels through the first set of positions;
the imager is integral with the magnetometer, and a fixed target is arranged in a field of vision of said imager, the trajectory information being derived from the pinpointing of the target in the images acquired by the imager when the magnetometer travels through the set of path positions;
a mechanical displacement device displaces the magnetometer from one position to another position in the first set of positions when the magnetometer travels through said set of path positions, the trajectory information being derived from position measurements of said mechanical displacement device or position set points of said mechanical displacement device;
the magnetometer is integral with inertial sensors configured to determine at each of the travel times accelerations and angular velocities, and the trajectory information is derived from said accelerations and angular velocities;

the magnetometer is arranged in a magneto-inertial unit.

The invention also relates to an automated data processing unit including a processor, a memory and input and output interfaces, configured to implement the method according to the invention, and notably to:

receive a plurality of measurements of the magnetic field acquired at acquisition times by a magnetometer travelling through a set of path positions, said positions being distinguished from each other by the spatial location of the magnetometer and/or by the orientation of the magnetometer;

receive trajectory information representative of the location and the orientation of a point integral with the magnetometer while travelling through the positions of the set of path positions at travel times, for each of a plurality of determination times determined from the acquisition times and the travel times, matching up of the measurements of the magnetic field and the magnetic field gradient with the trajectory information, determining the calibration parameters of the magnetometer by minimisation of a cost function involving, for a plurality of determination times, at least said calibration parameters, a measurement of the magnetic field, and a relationship linking the change in a magnetic field with the change in the location and in the orientation of the magnetometer derived from the trajectory information, the relationship linking the change in a magnetic field with the change in the location and in the orientation of the magnetometer locally translating an equation of the particular derivative of the magnetic field:

$$\dot{\vec{B}} = \nabla \vec{B} \cdot \vec{v} + \Omega \times \vec{B}$$

with $\vec{B}$ a magnetic field vector, $\nabla\vec{B}$ a magnetic field gradient vector, $\dot{\vec{B}}$ a vector of the time derivative of the magnetic field, $\vec{v}$ a velocity vector representative of the modification of the location and $\Omega$ a rotation matrix representative of the modification of the orientation.

The invention also relates to a computer programme product including programme code instructions recorded on a non-volatile support readable by a computer for the execution of the steps of the method according to the invention when said programme code instructions are executed on a computer.

DESCRIPTION OF THE FIGURES

The invention will be better understood thanks to the following description, which relates to embodiments and alternatives according to the present invention, given as non-limiting examples and explained with reference to the appended schematic drawings, in which:

FIG. 3 is a schematic diagram showing the steps of the calibration method according to a possible embodiment of the invention.

DETAILED DESCRIPTION

Position is taken to mean the combination of a location and an orientation, which makes it possible to describe completely the spatial configuration of an object. In a vector write of a space with three dimensions, the location is defined by a vector with three components (the spatial coordinates in a reference frame), and the orientation is also defined by a vector with three components (the angles of rotation with respect to the reference frame).

"Trajectory information" is taken to mean data representative of the position of a point integral with the magnetometer over time when the magnetometer travels through the set of path positions. The position of a point integral with the magnetometer may notably be that of a solid rigidly attached to the magnetometer. These data may be chronologically ordered according to travel times corresponding to each travel path position. These data may for example be locations and orientations or derivatives with respect to time thereof such as notably velocities or accelerations, angular velocities or angular accelerations.

An automated data processing unit, such as for example a computer, including at least one processor and a memory, is configured to implement the method. The automated data processing unit is also configured to receive at least measurements of the magnetic field coming from the magnetometer. Preferably, the automated data processing unit is also configured to receive measurements of a magnetic field gradient.

In the present description, the magnetometer to calibrate is a triaxial magnetometer capable of measuring the magnetic field along its three axes. The magnetometer may form part of a network of magnetometers integrally connected to a same sensor, such as for example in the case of a magneto-inertial unit, in which case the network of magnetometers also makes it possible to measure a magnetic field gradient in the reference frame of the sensor.

Figure 1:
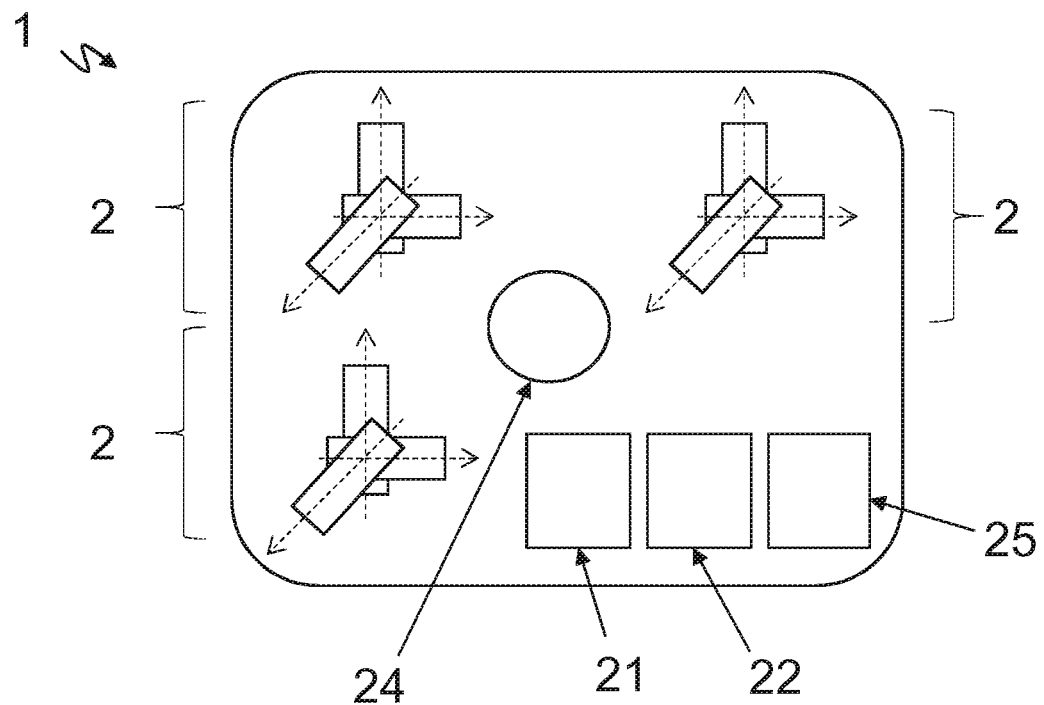
FIG. 1 is a diagram illustrating an example of equipment including magnetometers to calibrate.

As an illustration, FIG. 1 shows an example of a network of magnetometers 2 equipping a magneto-inertial unit 1. The magnetometers 2 are here triaxial magnetometers, each constituted of three monoaxial magnetometers oriented along axes substantially perpendicular with each other. The magneto-inertial unit 1 includes at least eight monoaxial magnetometers, and typically nine monoaxial magnetometers organised into three triaxial magnetometers 2, as represented in FIG. 1. The magnetometers 2 are integral with the magneto-inertial unit 1, i.e. they have a movement substantially identical in the terrestrial reference frame. The magneto-inertial unit 1 also includes inertial sensors such as accelerometers and gyrometers 24, generally three accelerometers and three gyrometers arranged in triaxis. The magneto-inertial unit 1 also includes processing means 21 (typically a processor), data storage means 22, and means for communicating 25 with an external device.

Within the scope of the calibration method, the magnetometer 2 travels through (step S1) a set of path positions, said path positions being distinguished from each other by a location of the magnetometer 2 and/or by an orientation of the magnetometer 2. Unlike methods of the prior art, there are no homogeneity or constancy constraints of the magnetic field in which the travel of the magnetometer 2 takes place. It is thus not necessary to have available an imposed or non-disturbed magnetic field. Preferably, the set of path positions is not defined a priori, it results from the displacement of the magnetometer 2 during its travel. The path positions are simply the positions taken by the magnetometer 2 during its travel.

To travel this path, the magnetometer 2 may simply be manually manipulated by an operator. It is also possible to provide a mechanical displacement device which displaces the magnetometer 2 from one path position to another path position. For example, this mechanical displacement device may be a robotised arm, a conveyor belt, or any other device making it possible to vary the location and the orientation of the magnetometer 2.

During its travel, the magnetometer 2 acquires at acquisition times a plurality of measurements of the magnetic field (step S2). Thus, for each acquisition time, the magnetometer 2 acquires a measurement $\vec{B}_m$ of the magnetic field, which depends on the location of the magnetometer 2 and its orientation. It is possible to filter the measurements of the magnetometer to compensate certain non-stationarities of the magnetic field. For example, electric currents of electrical installations can disturb the magnetic field. A filtering (for example a notch filtering) at 50 Hz or 60 Hz makes it possible to limit these disturbances. Similarly, the magnetic field generated by the location or position measurement system may be, if it is known, removed from the measurement of the magnetometer.

Trajectory information representative of the location and the orientation of a point integral with the magnetometer 2 while travelling at travel times are supplied (step S3). It is not necessary that this trajectory information reflects the absolute location or the absolute orientation of the magnetometer 2, for example with respect to a reference frame of the magnetic field which would be typically the terrestrial reference frame. Indeed, the method proposed exploits the change in a magnetic field with the change in the location and in the orientation of the magnetometer 2, and not the knowledge of the magnetic field at any point of the trajectory of the magnetometer 2. It thus suffices to know the location and the orientation of a point integral with the magnetometer 2 in the course of the travel.

Using a point integral with the magnetometer rather than the magnetometer 2 in itself has numerous advantages. Firstly, it is often easier to pinpoint the location and the orientation of a point integral with the magnetometer than the magnetometer itself. For example, when a target and an imager are used, it is the target or the imager that will be integral with the magnetometer 2 and of which the location and the orientation will be determined. Next, when several magnetometers 2 are organised into a network integral with each other, as is typically the case of a magneto-inertial unit 1, this makes it possible to be able to carry out the calibration of all the magnetometers 2 of the network with the same trajectory information. Apart from simplicity and a non-negligible time saving, this also makes it possible to harmonise the calibration of the magnetometers 2 with each other.

This trajectory information may be obtained in different ways. The trajectory information may be provided by the use of an imager pinpointing the location and the orientation of the magnetometer at each travel time when the magnetometer 2 travels through the path positions.

It is possible for example to fix rigidly an imager with the magnetometer 2 and to determine the trajectory information from the processing of the images acquired by the imager during the displacement of the assembly formed by the magnetometer 2 and the imager. It is possible for example to implement a simultaneous localisation and mapping (better known by the acronym SLAM) exploiting a stereovision of the imager, an additional depth camera or inertial sensors. In particular, in the case of an imager attached to a magneto-inertial unit 1 incorporating the magnetometer 2, it is possible to use the triplet imager/accelerometer/gyrometer to determine the trajectory information, using the SLAM or a vision/inertial odometry technique.

It is also possible to use a target or points of reference of which the positions are known. For example, the imager may be integral with the magnetometer 2 and a fixed target arranged in a field of vision of said imager. The trajectory information is then derived from the pinpointing of the target in the images acquired by the imager when the magnetometer 2 travels through the set of path positions. Finally, the imager may be fixed in the environment and optical targets fixed to the system (for example motion capture room).

Figure 2:
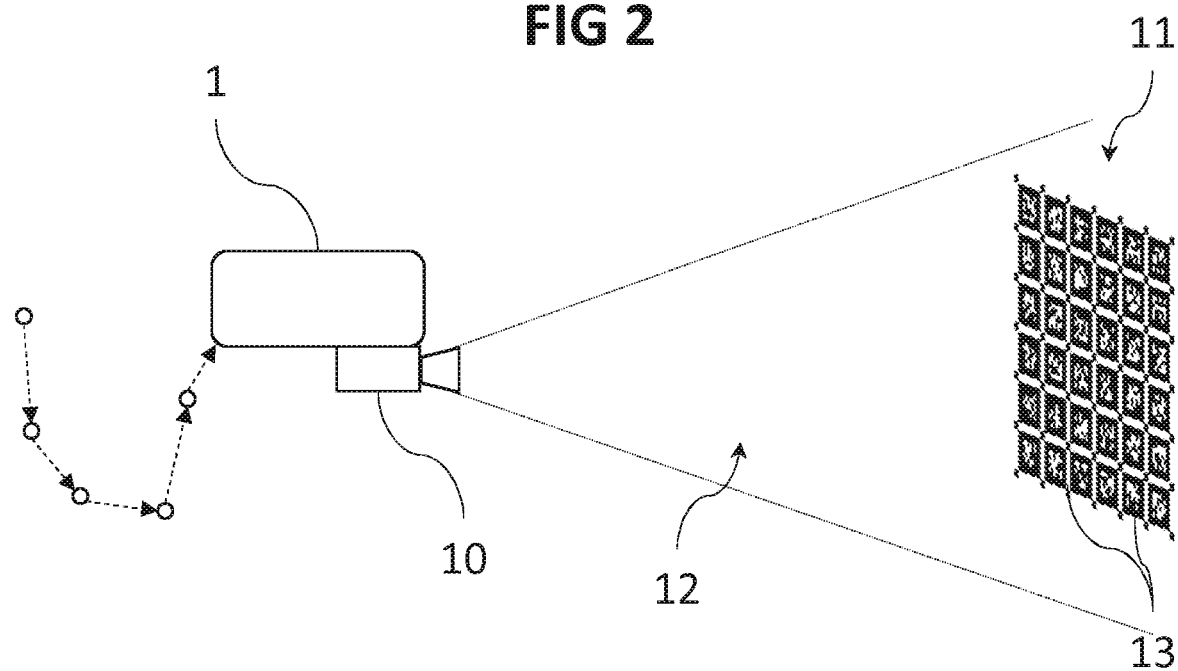
FIG. 2 is a diagram illustrating a possible configuration for the implementation of the calibration method according to a possible embodiment of the invention.

FIG. 2 thereby shows an example of configuration using a target when the magnetometer 2 moves from one path position to another. The imager 10 is here a camera integral with the inertial unit 1 incorporating the magnetometer 2. A target 11 is fixed in an external reference frame (typically the terrestrial reference frame) and arranged in the field of vision 12 of the imager 10. In this example, the target 11 includes several regularly distributed blocks 13 each having a distinct pattern, such that each block is identifiable. If necessary, the imager 10 may be calibrated beforehand by placing the target in front of the imager at different locations and according to different orientations in order to obtain a series of images showing the target 11 under different spatial configurations. A processing of the images detects in each of them the position of the projection of particular points of the target 11. This detected position is next used (for example by non-linear optimisation methods) to determine the intrinsic parameters of the imager 10, such as the focal length and distortion parameters as well as the position of the optical centre required for the expression of a projection/deprojection function for the optical system of the imager. The target 11 of this example is a flat target, which has the particularity of being easy to produce since it may be simply printed on a sheet of paper. It is also possible to use targets 11 in three dimensions, more difficult to produce but making the calibration easier and more precise.

The target 11 being fixed, an operator displaces the assembly formed by the imager 10 and by the magnetometer 1 while taking care to keep the target 11 in the field of vision 12 of the imager 10. The displacement movements may be made randomly or according to a preestablished path. The imager 10 acquires images during this displacement. The position of the target 11 is next detected in each image. The relative position of the imager 10 with respect to the fixed target 11 is then calculated by a vision algorithm by computer for each image, making it possible to determine the position of the imager 10 in the reference frame attached to the target 11 at the travel times corresponding to the filming times of the imager 10. The imager 10 being integral with the magnetometer 2, trajectory information is thereby obtained representative of the location and the orientation of a point integral with the magnetometer 2 while travelling along the path.

It is obvious that it is also possible to use a fixed imager 10 and a target 11 integral with the magnetometer 2. It is also possible to employ several targets 11 in order to enable greater freedom of movement. It is also possible to do without the target 11 if the pinpointing of the location and the orientation of the magnetometer in the images may be done directly from images of the assembly integrating the magnetometer 2. It is also possible to provide a motion capture configuration where several optical targets are arranged integral with the magnetometer 2.

Other methods make it possible to obtain this trajectory information. For example, in the case already mentioned where a mechanical displacement device displaces the magnetometer 2 from one path position to another path position, the trajectory information may be derived from position measurements or position setpoints of said mechanical displacement device. The use of a robotised arm notably makes it possible to have directly data on the location in space and on the orientation of the end of the robotised arm, which is a point integral with the magnetometer 2 that it bears.

It is further possible to exploit an optional radio-navigation system, for example with a receiver integral with the magnetometer 2 which receives waves transmitted by several stations. The position of the receiver is next determined by a triangulation method, merging the relative positions with respect to each transmitting station. Thus, any method making it possible to supply trajectory information representative of the location and the orientation of a point integral with the magnetometer 2 during travel may be employed. It is also possible to combine several methods.

In the case of a magnetometer 2 integrated in a magneto-inertial unit 1, it is also possible to compare the measurements of the accelerometers and the gyrometers with the trajectory information to be able to calibrate the accelerometers and gyrometers 24, and notably to eliminate biases therefrom. It is moreover possible to obtain the trajectory information from these measurements of the accelerometers and gyrometers 24. It is then even possible to calibrate simultaneously the magnetometers 2, the accelerometers and the gyrometers 24, by incorporating the different biases in the cost function which will be described hereafter.

The calibration method is based on the exploitation of measurements of the magnetic field, acquired at acquisition times, synchronous with trajectory information at travel times. Yet, these two types of data come from different origins, and the acquisition times generally do not correspond to the travel times. A matching up (step S4) is thus required between the magnetic field measurements and the trajectory information. This matching up aims to associate and synchronise the magnetic field measurements and the trajectory information, in order to be able to have available, for each of a plurality of determination times, a measurement of the magnetic field and trajectory information representative of the location and the orientation of a point integral with the magnetometer 2 at this determination time.

To this end, the matching up may include the interpolation of at least one set or sub-set among:
- a set of measurements of the magnetic field and the magnetic field gradient,
- a set of trajectory information.

For example, it may be necessary only to interpolate the trajectory information, because said information generally has a frequency lower than the magnetic field measurements. Indeed, a magnetometer 2 can easily acquire measurements of the magnetic field at a frequency of 200 Hz, whereas the trajectory information may be more fragmented, in particular when an imager 10 is used. However, it is also possible that it is the inverse. It should be noted that in the case where the acquisition times correspond to the travel times, the matching up is limited to associating the magnetic field measurements with trajectory information at the same times, which would then become determination times.

To interpolate a set, preferably temporal splines are used, but other approaches may be adopted, such as for example a discrete representation of the trajectory travelled by the magnetometer 2. The spline representation notably makes it possible to force the continuity of the trajectory. Preferably, the splines used for the interpolation are derivable at least twice. For example, it is possible to interpolate the locations and the orientations of the point integral with the magnetometer. The spline representation also makes it possible to optimise the different parameters involved, in particular the temporal synchronisation parameters, using a method based on the gradient of a criterion to minimise.

For example, when inertial sensors are integral with the magnetometer 2, as in the case of a magneto-inertial unit 1, it is then possible, by deriving the splines, to calibrate the acceleration or rotation measurements of these sensors. Indeed, the derivative of the orientation spline at each time step must be coherent with the debiased and harmonised measurement of the gyrometer. Similarly, the second derivative of the location spline at each time step must be coherent with the debiased and harmonised measurements of the accelerometers as well as with the estimated value of gravity.

Different parameters such as the coefficients of the splines, the inertial biases, the de-synchronisation of the inertial sensors, and the direction of gravity in the reference frame of the target, the difference in position between the imager 10 and the percussion point of the accelerometer, may be optimised to minimise a multicriteria cost function including gyrometric error terms, accelerometric error terms. These error terms are for example expressed as least squares. When an imager 10 and a target 11 are used, it is also possible to take into account in the cost function a reprojection criterion based on the comparison between the theoretical projection of particular points of the target and their positions in the images acquired by the imager 10.

Thanks to the matching up, it is possible to define a plurality of determination times for each of which one has available a magnetic field measurement and trajectory information representative of the location and the orientation of a point integral with the magnetometer at this trajectory time. The determination times are thus determined from the acquisition times and the travel times, since it is these times that determine the availability of the magnetic field measurements and trajectory information, or potentially their interpolation. Similarly, one can also have available for each determination time a magnetic gradient measurement if this measurement is available.

Preferably, the determination times are chosen sufficiently close together to avoid the magnetic field varying too much between the positions occupied by the magnetometer 2 between two consecutive determination times. In particular, when the magnetic field gradient is used, the determination times are preferably sufficiently close together to be able to consider the magnetic field gradient as locally uniform between the positions occupied by the magnetometer between two consecutive determination times. For example, the determination times are spaced apart by a duration less than or equal to 1 s, preferably less than or equal to 10 ms, and further preferably less than or equal to 5 ms. Similarly, the magnetometer 2 preferably acquires the measurements at a sufficient frequency to be able to correctly take account of the movement of the magnetometer. Preferably, the magnetometer 2 acquires the measurements at a frequency greater than 100 Hz, such as for example 200 Hz. However, these two preferences are not always useful. In particular, when the method uses an integral formulation, that is to say that one uses uniquely a model of the field as relationship linking the change in a magnetic field with the change in the location and in the orientation of the magnetometer as described hereafter, the travel, acquisition or determination times may be any distance apart.

To determine the calibration parameters of the magnetometer 2 (step S5), the method involves minimisation of a cost function involving, for a plurality of determination times, at least said calibration parameters, a measurement of the magnetic field, and a relationship linking the change in a magnetic field with the change in the location and in the orientation of the magnetometer 2 derived from the trajectory information.

Preferably, the cost function is based on comparisons between a theoretical estimation of the magnetic field at a determination time and a measurement of the magnetic field at said determination time, the theoretical estimation of the magnetic field taking into account the calibration parameters. Typically, the theoretical estimation of the magnetic field is determined from the relationship linking the change in a magnetic field with the change in the location and in the orientation of the magnetometer 2 derived from the trajectory information.

The theoretical estimation of the magnetic field may be determined at least from:
- a measurement of the magnetic field at a preceding determination time,
- the change in the location and in the orientation of a point integral with the magnetometer 2 between the determination time and the preceding determination time, determined from the trajectory information,
- calibration parameters.

Preferably, the theoretical estimation of the magnetic field is also determined from a measurement of the magnetic field gradient at the preceding determination time.

As an example, the relationship linking the change in a magnetic field with the change in the location and in the orientation of the magnetometer 2 derived from the trajectory information may be a local translation of the equation of the particular derivative of the magnetic field:

$$\dot{\vec{B}} = \nabla \vec{B} \cdot \vec{v} + \Omega \times \vec{B} \qquad (1)$$

with $\vec{B}$ a magnetic field vector, $\nabla \vec{B}$ a magnetic field gradient vector, $\dot{\vec{B}}$ a vector of the temporal derivative of the magnetic field, $\vec{v}$ a velocity vector representative of the modification of the location and $\Omega$ a rotation matrix representative of the rotation velocity, and thus of the modification of the orientation. Hereafter, the notation of the arrow on top of the vectors will be omitted, but it is clearly obvious that the fields, measurements, locations, orientations and biases are vectors. It is obviously possible to use other relationships linking the change in a magnetic field with the change in the location and in the orientation of the magnetometer, such as for example using the derivative of the equation (1), of the form $\nabla_n^{[<]BEGINITALm}B = f_n(\Omega) \cdot \nabla_n B + g_n(\nabla_{n+1} B) \cdot V$, where $\nabla_n B$ is an n-th derivative of the magnetic field, and $f_n$ and $g_n$ predetermined functions, as disclosed in the application FR1756675.

In concrete terms, this equation of the particular derivative of the magnetic field is integrated between two determination times $t_k$ and $t_{k+1}$ by:

$$B(t_{k+1}) = \hat{R}^T(t_{k+1})(\hat{R}(t_k)B(t_k) + \hat{R}(t_k)\nabla B(t_k)\hat{R}^T(t_k)(\hat{p}(t_{k+1}) - \hat{p}(t_k))) \qquad (2)$$

with $B(t_{k+1})$ the magnetic field at the determination time $t_{k+1}$ that is noted hereafter $B_{k+1}$, $B(t_k)$ the magnetic field at the preceding determination time $t_k$ that is noted hereafter $B_k$, $\nabla B(t_k)$ the magnetic field gradient at the preceding determination time $t_k$ noted hereafter $\nabla B_k$, $\hat{R}(t_{k+1})$ represents the orientation of the magnetometer 2 at the determination time $t_{k+1}$ that is noted hereafter $\hat{R}_{k+1}$, $\hat{R}(t_k)$ represents the orientation of the magnetometer 2 at the preceding determination time $t_k$ that is noted hereafter $\hat{R}_k$, $\hat{p}(t_{k+1})$ represents the location of the magnetometer 2 at the determination time $t_{k+1}$ noted hereafter $\hat{p}_{k+1}$, $\hat{p}(t_k)$ represents the location of the magnetometer 2 at the preceding determination time $t_k$ noted hereafter $\hat{p}_k$. By simplifying the notations, equation (2) becomes:

$$B_{k+1} = \hat{R}_{k+1}^T(\hat{R}_k B_k + \hat{R}_k \nabla B_k \hat{R}_k^T(\hat{p}_{k+1} - \hat{p}_k)) \qquad (3)$$

The location $\hat{p}(t)$ and the orientation $\hat{R}(t)$ are derived from the trajectory information provided previously. They may directly correspond to this trajectory information, or instead be obtained by calculation therefrom, for example by integrating them or by deriving them. It is also possible that the location or the localisation are calculated at the same time as the calibration parameters. It is thereby possible to combine in a same cost function the error terms relevant to the magnetic calibration with the error terms concerning other measurements, designated measurements sensors, which, taken alone, make it possible to determine the trajectory information (for example the projection of the visual targets or landmarks in the imager(s) or other reference). In this case, the estimation in position is not an intermediate output but an internal variable of the optimisation algorithm, and there is no distinction between "calculation of the localisation" and "magnetic calibration", the algorithm resolving the two problems by minimising a single and unique cost function. This is in particular the case when the trajectory information may be derived from a minimised cost function, for example in the case of an error in reprojection of a physical point on one/several imager(s) (in front of a target, during the SLAM, or in a motion capture room). This possibility applies to all the embodiments, and to all the trajectory information, and notably, apart from the location and the orientation, the derivatives thereof.

It is moreover possible to rewrite equation (3) as a function of the modifications of the location and the orientation. By noting $\hat{R}_k^{k+1}$ the orientation relative to the determination time $t_{k+1}$ with respect to the orientation at the preceding determination time $t_k$, that is to say the change in orientation between the preceding determination time $t_k$ and the determination time $t_{k+1}$, and by noting $_k\widehat{\delta p}_{k+1}$ the location of the magnetometer at the determination time $t_{k+1}$ in the reference frame defined by the location of the magnetometer at the preceding determination time $t_k$, one obtains:

$$B_{k+1} = (\hat{R}_k^{k+1} B_k + \hat{R}_k^{k+1} \nabla B_k \, _k\widehat{\delta p}_{k+1}) \qquad (4)$$

This fundamental relationship should be verified locally by the measurements of the magnetometer 2 if it was correctly calibrated. The existence of the different parameters to calibrate thus has the consequence of giving rise to deviations between the measurement of the magnetic field and a theoretical estimation of the magnetic field based on this relationship. It is by seeking to minimise the deviations appearing during the application of this relationship that it is possible to determine the values of the calibration parameters. To do so, a cost function to minimise is constructed. For a plurality of determination times, one expresses the relationship formulated by equation (3) or equation (4) by incorporating therein the parameters to calibrate tainting the measurement of the magnetic field by the magnetometer 2.

For example, if, to simplify, a focus is made on the compensation of the magnetic biases caused by hard iron effects, the measurement of the magnetic field at a determination time $t_k$ and the magnetic field gradient may be written:

$$B_k = Bm_k - B_b \qquad (5)$$

$$\nabla B_k = \nabla Bm_k - v2g(H_b) \qquad (6)$$

With $Bm_k$ the measurement of the magnetic field for the determination time $t_k$, $B_b$ the magnetometric bias affecting the measurement of the magnetic field, $\nabla Bm_k$ the magnetic field gradient measured for the determination time $t_k$, and $v2g(H_b)$ the magnetometric bias affecting the measurement of the magnetic field gradient. The magnetometric biases are thus parameterised by the vector $B_b$ of three dimensions and the vector $H_b$ of five dimensions, with v2g a function of transformation from vector to gradient such that:

$$v2g\left(\begin{bmatrix} a \\ b \\ c \\ d \\ e \end{bmatrix}\right) = \begin{bmatrix} a & b & c \\ b & d & e \\ c & e & -a-d \end{bmatrix} \quad (7)$$

By replacing in equation (3) the expressions of the magnetic field $B_k$ and the magnetic field gradient $\nabla B_k$ expressed in (5) and (6), it is possible to obtain a criterion to minimise based on a comparison between a theoretical estimation of the magnetic field, derived from the exploitation of the mentioned relationship, and at least one magnetic field measurement:

$$Bm_{k+1} - B_b = \hat{R}_{k+1}^T(\hat{R}_k(Bm_k - B_b) + \hat{R}_k(\nabla Bm_k - v2g(H_b))\hat{R}_k^T(\hat{p}_{k+1} - \hat{p}_k)) \quad (8)$$

The cost function may be constructed by adding a norm $\rho$ of this criterion for a plurality of determination times $t_k$:

$$\min_{B_b, H_b} \Sigma_{k=0}^N \rho(B_{k+1} - B_b - \hat{R}_{k+1}^T(\hat{R}_k(B_k - B_b) + \hat{R}_k(\nabla B_k - v2g(H_b))\hat{R}_k^T(\hat{p}_{k+1} - \hat{p}_k))) \quad (9)$$

The norm $\rho$ used may for example be the norm L2 (square root of the modules of the components), or the norm L1 (the sum of the modules of the components) which is more robust, or instead any other robust norm used in M-estimators (for example Huber, Cauchy or Tukey). The sum may not contain all the measurement samples of the magnetic field, a step of selection of the samples may take place upstream The cost function may then be minimised with respect to the biases $B_b$ and $H_b$ (or $v2g(H_b)$) by any algorithmic method, for example an iterative algorithm of Newton, Gauss-Newton, Levenberg-Marquard type, etc. in order to obtain the calibration parameters. Since the criterion (8) to which the norm is applied is linear in the bias parameters, the resolution of the minimisation is very efficient. The use of a robust norm requires however several iterations before convergence. A Gauss-Newton type algorithm may thus advantageously be used. Apart from methods based on an optimisation of the cost function of gradient descent type, other approaches may be used to minimise the cost function, such as for example with tools of the state observer type (Kalman filter, extended Kalman filter, Luenberger observer or other). It is thereby possible for example to construct an extended Kalman filter from the prediction (8) where the matrix of covariance of the error represents the cost function to minimise.

The above example has been simplified to a case where the only parameters to calibrate are constant magnetometric biases. The same approach may also be employed to determine other calibration parameters, such as scale factors of measurements, or spatial configuration parameters of the magnetometer, such as for example the orientation positions of the magnetometer with respect to the point integral with the magnetometer for which the trajectory information is provided. This method thus makes it possible to estimate the geometry of a network of magnetometers. It is also possible to use the minimisation of the cost function to determine the parameters of a parametric model of the magnetic field in which the magnetometer 2 moves when it travels through the path positions.

As indicated above, the method may advantageously be employed to calibrate several magnetometers 2 at the same time, in particular when they are integrated in a magneto-inertial unit 1. In the example below, several magnetometers 2 form a network, and the parameters to calibrate aim to compensate not only one or several magnetometric biases affecting the measurement of the magnetic field, but also scale factors. One assumes that a measurement of a magnetometer 2 $i$ of a network is described in a linear manner according to the equation.

$$B_{mi} = D_i B + b_i \quad (10)$$

Where B is the real magnetic field and $B_{mi}$ the measurement of the magnetic field of the magnetometer i (polluted by a scale factor $D_i$ which may be diagonal or a full matrix and a bias $b_i$). It should be noted however that other magnetometric parameters could be used in a similar manner.

Returning to the relationship expressed by the equation (1), with a first order local modelling of the magnetic field around a reference magnetometer 2 (index 0) of the network, the magnetometer 2$i$ at the position $dx_i$ of a set of magnetometers positioned in a close volume gives the measurement of the magnetic field $B_{mi}$ by the magnetometer 2$i$:

$$B_{mi} = D_i \cdot (B_0 + \nabla B_0 \cdot dx_i) + b_i \quad (11)$$

With $B_0$ the magnetic field at the position of the reference magnetometer 2, and $\nabla B_0$ the magnetic field gradient at the position of the reference magnetometer 2.

Equation (11) may be re-written while involving the vectorised gradient matrix column by column $Vec(\nabla B)$:

$$B_{mi} = ([1, dx_i^T] \otimes D_i) \begin{bmatrix} B_0 \\ Vec(\nabla B_0) \end{bmatrix} + b_i \quad (12)$$

where $\otimes$ represents here the Kronecker product on the matrices.

For a set of n triaxial magnetometers 2, the measurements and the magnetometric biases may be concatenated:

$$B_m = \begin{bmatrix} [1, dx_1^T] \otimes D_1 \\ \vdots \\ [1, dx_n^T] \otimes D_n \end{bmatrix} \begin{bmatrix} B_0 \\ Vec(\nabla B_0) \end{bmatrix} + b \quad (13)$$

$$B_m = \text{diag}(D_1, \ldots, D_n) \begin{bmatrix} [1, dx_1^T] \otimes I_{3\times3} \\ \vdots \\ [1, dx_n^T] \otimes I_{3\times3} \end{bmatrix} \begin{bmatrix} B_0 \\ Vec(\nabla B_0) \end{bmatrix} + b \quad (14)$$

It is then possible to note $$C_{mag} = \begin{bmatrix} [1, dx_1^T] \otimes I_{3\times3} \\ \vdots \\ [1, dx_n^T] \otimes I_{3\times3} \end{bmatrix} \quad (15)$$

The size of $C_{mag}$ equals (n,12). According to the rank of the matrix $C_{mag}$, there may be or not ambiguity on the magnetic field and the magnetic field gradient. Consequently, the relationship between $$\begin{bmatrix} B_0 \\ Vec(\nabla B_0) \end{bmatrix}$$

and the measurements $B_m$ may be inversible or not. If the rank of the matrix is smaller than its line number, it is possible to reduce the number of parameters of the first order field model by taking into account the constraints linked to the Maxwell equations (the gradient is symmetric with zero trace).

In these two cases one notes $C_{mag}^\dagger$ the linear relationship that verifies:

$$\begin{bmatrix} B_. \\ Vec(\nabla B_.) \end{bmatrix} = C_{mag}^\dagger D_{inv}[B_m - b] \qquad (16)$$

with $$D_{inv} = \text{diag}\left(\frac{1}{D_1}, \ldots, \frac{1}{D_n}\right).$$

By assuming the magnetic field stationary globally, it is possible to write throughout the trajectory of a magnetometer 2 the relationship linking the change in the magnetic field with the change in the location and in the orientation of said magnetometer 2:

$$\dot{B} = -\omega \times B_0 + \nabla B_0 \cdot v \qquad (17)$$

with ω the rotation velocity of the magnetometer, and v its velocity of displacement (change in location). It thus involves a reformulation of the relationship formulated by equation (1).

The change in the measurement of the magnetic field of the reference magnetometer 2 between two determination times is linked to the difference in position derived from the trajectory information. Thanks to the trajectory information, one has available the change in location and orientation of the magnetometers 2. Indeed, the magnetometers of the network are integral with each other, and the trajectory information is representative of the location and the orientation of a point integral with these magnetometers 2. Preferably, the location and the orientation of the reference magnetometer 2 are determined from the trajectory information.

By noting $\delta \tilde{R}_{pred}$ the rotation matrix (known) going from the orientation of the reference magnetometer 2 at the preceding determination time $t_k$ and the orientation of the same reference magnetometer 2 at the determination time $t_{k+1}$ and $\widetilde{dx}_{pred}$ the location (known) of this same reference magnetometer 2 at the determination time $t_{k+1}$ in the reference frame formed by the same reference magnetometer 2 at the preceding determination time $t_k$, a theoretical estimation of the field at the determination time $t_{k+1}$ is written, from the magnetic field and the magnetic field gradient at the preceding determination time $t_k$:

$$B_{k+1} = \delta \tilde{R}_{pred}(B_k + \nabla B_k \widetilde{dx}_{pred}) \qquad (18)$$

The theoretical estimation may be stated in the space of the measurements (polluted by the parameters to calibrate) of the reference magnetometer 2. The predicted measurement $B_{0pred}(\hat{b}, \hat{D}_i; \widetilde{dx}_{pred}, \delta\tilde{R}_{pred}; \tilde{B}_{m;k})$ may then be expressed as a function of the estimates of the bias $\hat{b}$ and the scale factor $\hat{D}_i$, as well as the inputs $\widetilde{dx}_{pred}, \delta\tilde{R}_{pred}, \tilde{B}_{m;k}$, with $\tilde{B}_{m;k}$ the measurement of the magnetic field by the reference magnetometer 2 at the preceding determination time $t_k$.

Indeed, the measurements of the magnetic field at the preceding determination time $t_k$ make it possible to generate a local model of the magnetic field around the position of the reference magnetometer 2 at the preceding determination time $t_k$:

$$\begin{bmatrix} \hat{B}_k \\ Vec(\nabla \hat{B}_k) \end{bmatrix} = \hat{C}_{mag}^\dagger \cdot D_{inv}[\tilde{B}_{m;k} - \hat{b}] \qquad (19)$$

This local modelling makes it possible to formulate a theoretical estimation of the measurement of the magnetic field by the reference magnetometer 2. The passage from the theoretical estimation of the magnetic field to the theoretical estimation of the measurement of the magnetic field is done by applying estimates of the calibration parameters, in this case the estimate of the magnetometric bias $\hat{b}$ and the estimate of the scale factor $\hat{D}_i$:

$$B_{0pred}(\hat{b}, \hat{D}_i; \widetilde{dx}_{pred}, \delta\tilde{R}_{pred}, \tilde{B}_{m;k}) == \hat{D}_0 \delta\tilde{R}_{pred}(\hat{B}_k + \nabla \hat{B}_k \widetilde{dx}_{pred}) + \hat{b}_0 = \qquad (20)$$

$$\hat{D}_0 \delta\tilde{R}_{pred}\hat{B}_k + \hat{D}_0 \delta\tilde{R}_{pred}\nabla \hat{B}_k \widetilde{dx}_{pred} + \hat{b}_0 =$$

$$([1, \widetilde{dx}_{pred}^T] \otimes \hat{D}_0 \delta\tilde{R}_{pred}) \begin{bmatrix} \hat{B}_k \\ Vec(\nabla \hat{B}_k) \end{bmatrix} + \hat{b}_0$$

By injecting (19) into (20), the relationship is obtained linking the estimation of the measurement at the determination time $t_{k+1}$ to the measurements at the preceding determination time $t_k$ and to the parameters of the model of each magnetometer 2:

$$B_{0pred}([1, \widetilde{dx}_{pred}^T] \otimes \hat{D}_0 \delta\tilde{R}_{pred})[\hat{C}_{mag}^\dagger D_{inv}[\tilde{B}_{m;k} - \hat{b}]] + \hat{b}_0 \qquad (21)$$

This relationship makes it possible to construct the following prediction:

$$B_{0pred}(\hat{b},\hat{D}_i; \widetilde{dx}_{pred}, \delta\tilde{R}_{pred}, \tilde{B}_{m;k}) = ([1, \widetilde{dx}_{pred}^T]$$
$$\otimes \hat{D}_0 \delta\tilde{R}_{pred})[\hat{C}_{mag}^\dagger D_{inv}[\tilde{B}_{m;k} - \hat{b}]] + \hat{b}_0 \qquad (22)$$

It is then possible to construct the cost function from residuals in the measurement space in the following manner:

$$\Sigma_k \rho(B_{k+1,0pred;k+1},(\hat{b},\hat{D}_i; \widetilde{dx}_{pred}, \delta\tilde{R}_{pred}, \tilde{B}_{m;k}) - \tilde{B}_{m;k+1}) \qquad (23)$$

Where, as previously, ρ is a norm which may be the norm L2, the norm L1 or another norm, and $\tilde{B}_{m;k+1}$ represents the measurement of the magnetic field by a magnetometer, polluted by a scale factor and a bias. The sum may not contain all the magnetic field measurement samples, a step of selection of the samples being able to take place upstream. The cost function may then be minimised with respect to the estimates (noted with a circumflex accent here) by an algorithmic method, for example an iterative algorithm of Newton, Gauss-Newton, Levenberg-Marquard type, etc. in order to obtain the calibration parameters. As previously, apart from methods based on an optimisation of the cost function of gradient descent type, other approaches may be used to minimise the cost function, such as for example with state observer type tools (Kalman filter, extended Kalman filter, Luenberger observer or other). It is thereby possible for example to construct an extended Kalman filter from the prediction (22) where the covariance matrix of the error represents the cost function to minimise.

It should be noted that the minimum of the cost function formulated by the equation (23) may not be unique. The minimums then correspond to degenerated situations. For example, it may be shown that in certain cases certain linear combinations of magnetometric biases are not observable, even if it is only sought to estimate them (for example by assuming scale factors to the unit). In this case, it is easily possible to re-parameterise the influence of the magnetometric biases in the cost function formulated by the equation (23) on an observable sub-space by making the following change in variable:

$$[/\$]\$\char`\^\$\$[/\$]\$\char`\^ A\hat{A}\hat{b} \leftarrow [b_0;[\hat{C}_{mag}]_{4:8} D_{in}, \hat{b}]^T \quad (24)$$

where the notation $[X]_{i:j}$ corresponds to the sub-matrix formed by the lines of X of which the index lies between i and j included. This comes down to bringing the cost function (24) to the cost function formulated in (9). It may also be necessary to fix at least one of the scale factors, or instead an average global scale factor to reject the degenerated situation in which all the scale factors are identically zero. Other solutions to the problems of non-unicity, such as regularisation, make it possible to avoid that the non-unicity of the minimum does not affect the convergence of the algorithm. These regularisation methods act at the level of the minimisation method by limiting the modification of the estimate along a direction not varying the cost function. These remarks apply to the different formulations of the cost functions.

The above example is given as a non-limiting example for the case of a network of triaxial magnetometers 2. It could also be possible to envisage considering a network of monoaxial magnetometers 2. The measurement model expressed by (10) then becomes, for each of the axes:

$$B_{mi} = f_i^T \cdot B + b_i \quad (25)$$

where B is the real magnetic field and $B_{mi}$ the magnetic field measurement, $f_i$ a dimension vector 3, associated with the sensitivity of the sensor and $b_i$ the bias of this sensor. In this case, with the same reasoning as that presented in the case of the network of triaxial magnetometers 2, it is possible to deduce a similar cost function which depends in addition on new parameters:

$$\Sigma_k \rho(B_{k+1;0pred;k+1}(\hat{b}, \hat{f}_i; \widetilde{\mathbf{dx}}_{pred}, \delta \tilde{R}_{pred}, \tilde{B}_{m;k}) - \tilde{B}_{m;k+1}) \quad (26)$$

The above examples exploit the relationship established by the equation of the particular derivative of the magnetic field 1, optionally with a local first order approximation as in (11). It is however possible to adopt a simpler approach when the magnetic field in which takes place the travel of the magnetometer 2 is stationary, that is to say independent of time but dependent on space.

Let us assume that one has n monoaxial magnetometers 2 with affine response placed rigidly on a sensor card, as in the case of a magneto-inertial unit 1. The measurements of these magnetometers 2 may be modelled by:

$$m_i(B) = \langle a_i | B \rangle + b_i \quad (27)$$

where $a_i$ represents the three calibration parameters of the monoaxial magnetometer 2 $i$ associated with its linear response with respect to the magnetic field B expressed in the sensor frame, and $b_i$ is a scalar representing the bias of the monoaxial magnetometer 2 $i$. Each magnetometer 2 being placed at a different position on the sensor card, if $x_i$ notes the vector representing the position in a fixed reference frame with respect to the sensor card, then it is possible to write as a first approximation that at determination time $t_k$:

$$m_i(B, t_k) = \langle a_i | B(x_i, t_k) \rangle + b_i \quad (28)$$

where B represents the magnetic field in sensor reference frame as a function of the position and the time. When the sensor card is moved in a magnetic field assumed stationary (independent of time, but dependent on space)) to travel through a set of path positions, the magnetic field B seen in the reference frame of the magnetometer 2 only depends on the location and the orientation of the sensor card in space. Since these locations and orientations are known through the provided trajectory information, simultaneously with the measurements of the magnetic field derived from the magnetometers 2 for each determination time, then the parameters $a_i$, $x_i$, and $b_i$, are observable, to a nearest global scale factor for the parameters $a_i$ corresponding to the magnetic field unit, from the moment that the system is placed in an inhomogeneous stationary field, that is to say that it depends on space. It should be noted however that the global scale factor for the parameters $a_i$, which corresponds to a standardisation of the measurement system on a magnetic field unit, may be superfluous for certain applications, such as a magnetic tachymeter of a magneto-inertial unit 1 or the calculation of heading.

A possible cost function to minimise may then be of generic formula $$E = \Sigma_j \rho(m_i(t_j) - (\langle a_i | B(x_i, t_j) \rangle + b_i)) \quad (29)$$

where $m_i(t_j)$ represents the measurement at the determination time $t_j$ derived from the magnetometer $2i$, for the parameters $a_i$, $x_i$, and $b_i$ and a description of the stable magnetic field B in the position reference, and p a norm as previously explained.

As an example, if the magnetic field gradient is considered as spatially constant, the magnetic field may be described by an affine model. By noting u the spatial variable describing the location in the external reference frame, it is possible to describe the magnetic field as being:

$$B_0(u) = B_0(0) + \nabla B(0) \cdot 0 \quad (30)$$

where $B_0(0)$ is a constant vector representing the magnetic field at a reference position, and $\nabla B(0)$ is a symmetric matrix with zero trace representing the magnetic field gradient at the reference position.

By noting
 $O(t_j)$ the position of the origin of the sensor frame in the external reference frame at the time $t_j$,
 $R(t_j)$ the rotation matrix representing the orientation of the sensor card with respect to the external reference frame at the time $t_j$,
 $B_0(u)$ the magnetic field in an external reference frame, function of u,
 it is possible to write:

$$B(x_i, t_j) = R^T(t_j) B_0(O(t_j) + R(t_j) x_i) \quad (31)$$

By combining equation (30) with equation (31), it becomes:

$$B(x_i, t_j) = R^T(t_j)(B_0(0) + \nabla B(0) \cdot (O(t_j) + R(t_j) x_i)) \quad (32)$$

This expression (32) may be injected into the cost function E given as example in the expression (29). For example, with ρ the norm L2 to the square, one obtains:

$$E = \Sigma_j (m_i(t_j) - (\langle a_i | R^T(t_j)(B_0(0) + \Delta B(0) \cdot (O(t_j) + R(t_j) x_i)) \rangle + b_i))^2 \quad (33)$$

By minimising the cost function, it is thereby possible not only to determine the scale and orientation factors $a_i$ and the biases $b_i$ but also identify by way of description of the field the three independent parameters $B_0(0)$ and the five independent parameters of $\nabla B(0)$. One can thus proceed without any information on the magnetic field other than its stationarity, since the parameters of the model of the magnetic field are determined via the cost function.

The method may also be applied similarly using other magnetic field models as relationship linking the change in a magnetic field with the change in the location and in the orientation of the magnetometer. Thus, it is possible to use magnetic field models with a development to higher orders, by estimating for example the Hessian of this magnetic field or higher order derivatives.

Once the parameters for calibrating a magnetometer 2 have been determined, it suffices to apply to the measurements of the magnetometer 2 the corrections resulting from the calibration parameters to calibrate the magnetometer (step S6). For example, to compensate a magnetometric bias b, it suffices to subtract from the measurement the value of bias b determined during the calibration.

It is to be noted that the present calibration method may be implemented not only during a standardisation of the magnetometer prior to its use, but also during the use of the magnetometer, in order to recalibrate said magnetometer while in use. It suffices indeed to have available trajectory information. This is notably the case for a magneto-inertial unit.

The invention also relates to a computer programme product including programme code instructions recorded on a non-volatile support readable by a computer for the execution of the steps of the method according to the invention when said programme code instructions are executed on a computer.

The invention is not limited to the embodiment described and represented in the appended figures. Modifications remain possible, notably from the point of view of the constitution of various technical characteristics or substitution of technical equivalents, without all the same going beyond the protection domain of the invention.

The invention claimed is:

1. A method for calibrating a magnetometer including the following steps:
   the magnetometer travels through a set of path positions, said path positions being distinguished from each other by a location of the magnetometer and/or by an orientation of the magnetometer;
   acquisition by the magnetometer at acquisition times of a plurality of measurements of a magnetic field when the magnetometer travels through said set of path positions and determination of a magnetic field gradient for said acquisition times;
   provision of trajectory information representative of the location and the orientation of a point integral with the magnetometer at a plurality of travel times while the magnetometer travels through the set of path positions,
   for each of a plurality of determination times determined from the acquisition times and the travel times, matching up of the measurements of the magnetic field with the trajectory information by associating and synchronizing measurements of the magnetic field and trajectory information in order to have, for each one of said plurality of determination times, a measurement of the magnetic field, a magnetic field gradient, and trajectory information representative of the location and the orientation of a point integral with the magnetometer at said determination time,
   determination of calibration parameters of the magnetometer by minimisation of a cost function involving, for a plurality of determination times, at least said calibration parameters, a measurement of the magnetic field at said determination time, and a relation which links change in the magnetic field with change in the location and in the orientation of the magnetometer derived from the trajectory information at said determination times,
   wherein the cost function is based on comparisons between a theoretical estimation of the measurement of the magnetic field at a determination time and a measurement of the magnetic field at said determination time, and wherein the theoretical estimation of the magnetic field is determined from the relation linking the change in a magnetic field with the change in the location and in the orientation of the magnetometer derived from the trajectory information, the theoretical estimation of the magnetic field being also determined from the magnetic field gradient at a preceding determination time,
   wherein the relation locally expresses, at each determination time, an equation of a particular derivative of the magnetic field:

$$\dot{\vec{B}} = \nabla\vec{B} \cdot \vec{v} + \Omega \times \vec{B}$$

with $\vec{B}$ a magnetic field vector, $\nabla\vec{B}$ a gradient vector of the magnetic field, $\dot{\vec{B}}$ a vector of a time derivative of the magnetic field, $\vec{v}$ a velocity vector representative of a modification of the location of the magnetometer and $\Omega$ a rotation matrix representative of a modification of the orientation of the magnetometer.

2. The method according to claim 1, wherein the cost function involves error terms concerning sensor measurements, said sensor measurements taken alone allowing to obtain the trajectory information, the trajectory information then being determined at a same time as the calibration parameters.

3. The method according to claim 1, wherein the minimisation of the cost function is carried out with a state observer.

4. The method according to claim 1, wherein the theoretical estimation of the magnetic field takes into account the calibration parameters.

5. The method according to claim 1, wherein the theoretical estimation of the measurement of the magnetic field is determined from the relation which links the change in a magnetic field with the change in the location and in the orientation of the magnetometer derived from the trajectory information.

6. The method according to claim 1, wherein the theoretical estimation of the measurement of the magnetic field is determined at least from:
   a measurement of the magnetic field at a preceding determination time,
   the change in the location and in the orientation of a point integral with the magnetometer between the determination time and the preceding determination time, determined from the trajectory information,
   calibration parameters.

7. The method according to claim 6, also including an acquisition at acquisition times of a plurality of measurements of a gradient of the magnetic field when the magnetometer travels through said set of path positions, and the theoretical estimation of the magnetic field is also determined from a measurement of the gradient of the magnetic field at the preceding determination time.

8. The method according to claim 1, wherein the theoretical estimation of the measurement of the magnetic field at a determination time is determined from:

a strength of the magnetic field at a reference point,
a gradient of the magnetic field at said reference point, and
a difference between the location of the point integral with the magnetometer and the location of the reference point,
a rotation between the orientation of the point integral with the magnetometer and an orientation at the reference point,
the strength of the magnetic field at a reference point and the gradient of the magnetic field at said reference point being determined by minimisation of the cost function.

9. The method according to claim 1, wherein the calibration parameters include:
a first magnetometric bias affecting the measurement of the magnetic field, and/or
a second magnetometric bias affecting a measurement of a gradient of the magnetic field, and/or
a scale parameter affecting an amplitude of the measurement of the magnetic field and/or
spatial configuration parameters of the magnetometer.

10. The method according to claim 1, wherein the matching up consists in interpolating at least one set among:
a set of measurements of the magnetic field and the magnetic field gradient,
a set of trajectory information,
such that each determination time corresponds to at least one measurement of the magnetic field and trajectory information.

11. The method according to claim 1, wherein the trajectory information is provided by using an imager pinpointing the location and the orientation of the magnetometer at each travel time when the magnetometer travels through the first set of positions.

12. The method according to claim 11, wherein the imager is integral with the magnetometer, and a fixed target is arranged in a field of vision of said imager, the trajectory information being derived from the pinpointing of the target in images acquired by the imager when the magnetometer travels through the set of path positions.

13. The method according to claim 1, wherein a mechanical displacement device displaces the magnetometer from one position to another position in the first set of positions when the magnetometer travels through said set of path positions, the trajectory information being derived from position measurements of said mechanical displacement device or position setpoints of said mechanical displacement device.

14. The method according to claim 1, wherein the magnetometer is integral with inertial sensors configured to determine at each of the travel times accelerations and angular velocities, and the trajectory information is derived from said accelerations and angular velocities.

15. The method according to claim 1, wherein the magnetometer is arranged in a magneto-inertial unit.

16. A non-transitory computer-readable medium including programme code instructions recorded thereon causing a computer to execute the steps of the method according to claim 1 when non-transitory computer-readable medium is read by the computer.

17. An automated data processing unit including a processor, a memory and input and output interfaces, configured to:
receive a plurality of measurements of a magnetic field acquired at acquisition times by a magnetometer travelling through a set of path positions, said positions being distinguished from each other by spatial location of the magnetometer and/or by orientation of the magnetometer, and obtaining a magnetic field gradient for said acquisition times;
receive trajectory information representative of the location and the orientation of a point integral with the magnetometer while travelling through the positions of the set of path positions at the travel times,
for each of a plurality of determination times determined from the acquisition times and the travel times, matching up of the measurements of the magnetic field and the magnetic field gradient with the trajectory information by associating and synchronizing measurements of the magnetic field and trajectory information in order to have, for each one of said plurality of determination times, a measurement of the magnetic field, a magnetic field gradient, and trajectory information representative of the location and the orientation of a point integral with the magnetometer at this determination time,
determining the calibration parameters of the magnetometer by minimisation of a cost function involving, for a plurality of determination times, at least said calibration parameters, a measurement of the magnetic field, and a relation which links the change in the magnetic field with the change in the location and in the orientation of the magnetometer derived from the trajectory information at said determination times,
wherein the cost function is based on comparisons between a theoretical estimation of the measurement of the magnetic field at a determination time and a measurement of the magnetic field at said determination time, and wherein the theoretical estimation of the magnetic field is determined from the relation linking the change in a magnetic field with the change in the location and in the orientation of the magnetometer derived from the trajectory information, the theoretical estimation of the magnetic field being also determined from the magnetic field gradient at a preceding determination time,
wherein the relation locally expresses an equation of the particular derivative of the magnetic field at each determination time:

$$\dot{\vec{B}} = \nabla \vec{B} \cdot \vec{v} + \Omega \times \vec{B}$$

with $\vec{B}$ a magnetic field vector, $\nabla \vec{B}$ a magnetic field gradient vector, $\dot{\vec{B}}$ a vector of a temporal derivative of the magnetic field, $\vec{v}$ a velocity vector representative of a modification of the location of the magnetomenter and $\Omega$ a rotation matrix representative of the modification of an orientation of the magnetometer.

* * * * *